United States Patent [19]

Coe et al.

[11] Patent Number: 4,659,987

[45] Date of Patent: Apr. 21, 1987

[54] ELECTRICAL CIRCUIT TEST PROBE AND CONNECTOR

[75] Inventors: Thomas D. Coe, Boxford; Robert F. Gross, Melrose, both of Mass.

[73] Assignee: QA Technology Company, Exeter, N.H.

[21] Appl. No.: 715,539

[22] Filed: Mar. 25, 1985

[51] Int. Cl.⁴ .................. G01R 31/26; G01R 31/02
[52] U.S. Cl. ...................... 324/158 P; 324/72.5
[58] Field of Search .............. 324/158 F, 158 P, 72.5

[56] References Cited

U.S. PATENT DOCUMENTS

| | | | |
|---|---|---|---|
| 720,908 | 12/1954 | Wernert | 38/1 |
| 2,885,648 | 5/1959 | King | 339/36 |
| 2,896,981 | 7/1959 | Cooney | 287/20.5 |
| 2,934,738 | 4/1960 | Abrams | 339/108 |
| 3,109,689 | 11/1963 | Cooney | 339/59 |
| 3,153,561 | 10/1964 | Cooney | 339/61 |
| 3,278,890 | 10/1968 | Cooney | 339/256 |
| 3,416,125 | 12/1968 | Theve | 339/177 |
| 3,435,168 | 3/1969 | Cooney | 200/166 |
| 3,562,643 | 2/1971 | Smith | 324/72.5 |
| 3,675,189 | 7/1972 | Smith | 339/221 |
| 3,753,103 | 8/1973 | Tetreault et al. | 324/72.5 |
| 4,050,762 | 9/1977 | Hines et al. | 339/108 |
| 4,108,528 | 8/1978 | Long et al. | 339/117 |
| 4,114,093 | 9/1978 | Long | 324/73 |
| 4,138,186 | 2/1979 | Long et al. | 339/117 |
| 4,168,873 | 9/1979 | Luna | 339/97 |
| 4,176,900 | 12/1979 | Hines et al. | 339/75 |
| 4,200,351 | 4/1980 | Long et al. | 339/108 |
| 4,209,745 | 6/1980 | Hines | 324/158 |
| 4,288,745 | 9/1981 | Plante et al. | 324/158 |
| 4,321,532 | 3/1982 | Luna | 324/158 |
| 4,377,318 | 3/1983 | Long | 339/75 |
| 4,397,519 | 8/1983 | Cooney | 339/255 |
| 4,409,191 | 10/1983 | Osman | 423/220 |
| 4,427,250 | 1/1984 | Hines et al. | 339/75 |
| 4,461,993 | 7/1984 | Glau | 324/158 |

FOREIGN PATENT DOCUMENTS 295939 3/1932 Italy .

Primary Examiner—Ernest F. Karlsen
Assistant Examiner—Vinh P. Nguyen
Attorney, Agent, or Firm—Hayes, Davis & Soloway

[57] ABSTRACT

An improvement to electrical circuit test probes of the type wherein a socket tube having a cylindrical spring loaded plunger therein is mounted in a test fixture. Electrical contact is assured between the socket and the plunger as the plunger moves longitudinally by the plunger having a resiliently flexible wand extending inwardly therefrom at an angular offset to the longitudinal axis of the plunger and the wand terminating in a bulbous contact member. The contact member is disposed within a cylindrical plunger tube and passes through an opening through which the contact member cannot pass. As a result, the wand acts as a flexible resilient finger holding the contact member firmly against the inner wall of the plunger tube as the plunger is moved in and out through its limits of movement.

8 Claims, 19 Drawing Figures

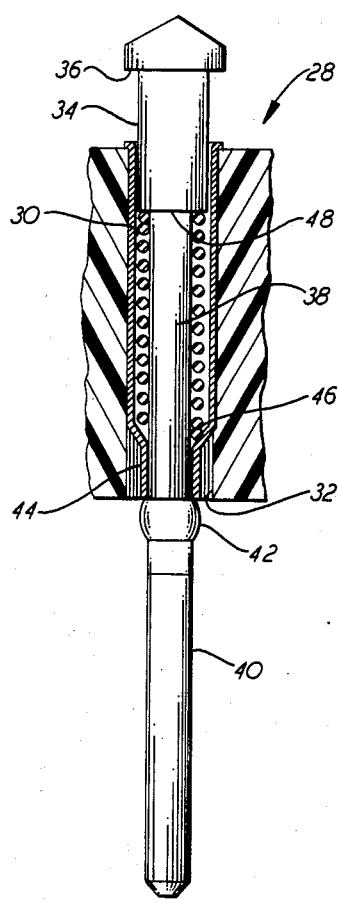
FIG. 3
Prior Art
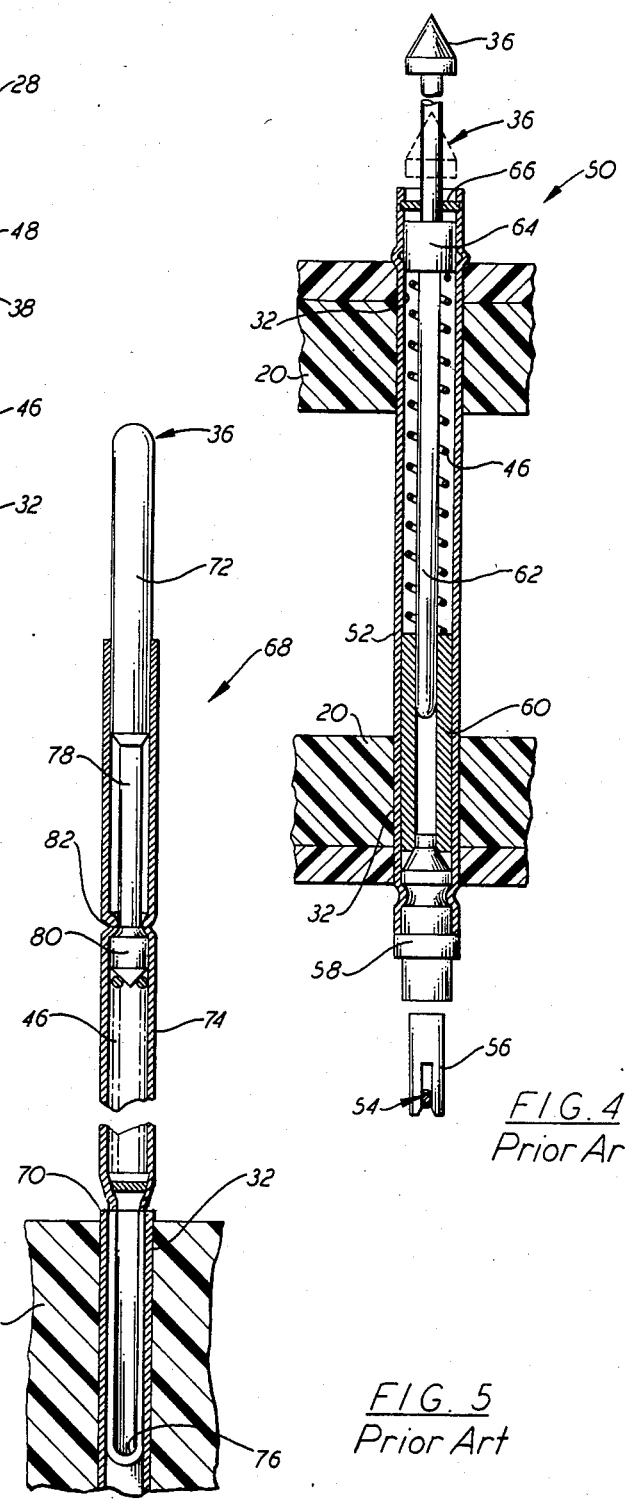
FIG. 4
Prior Art
FIG. 5
Prior Art

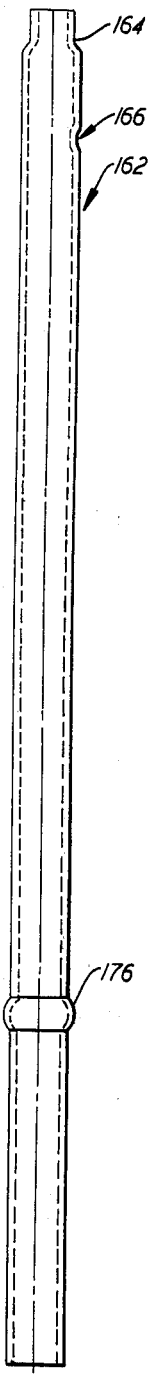
FIG. 15
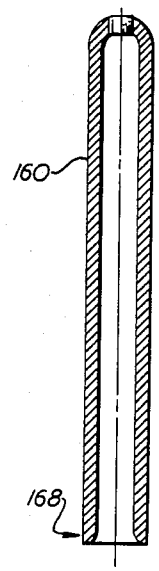
FIG. 16
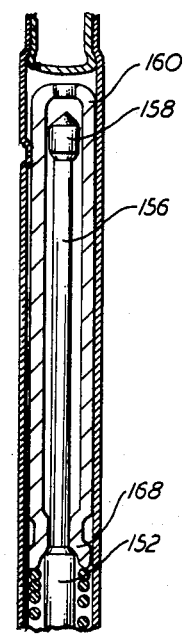
FIG. 19
FIG. 17

ELECTRICAL CIRCUIT TEST PROBE AND CONNECTOR

BACKGROUND OF THE INVENTION

The present invention relates to electrical circuit test probes and electrical connectors therefor and, more particularly, to an electrical circuit test probe with a spring loaded plunger in a socket tube having an offset wand extending therefrom to contact the interior of a member disposed within the socket tube and wherein the socket tube is provided with a releasable connector for a conductor comprising a plug housing formed in the end of the socket tube and a collet jawed plug for gripping the electrical conductor and slidably fitting within the plug housing to grip the conductor and hold it therein in electrical contact.

Of necessity, electrical circuit testing has made rapid strides in its technology in the past few years. Until the advent of miniaturization, circuit testing, took the form shown in FIG. 1. To test whether a large fuse 10 was electrically conductive, a pair of large, hand-held probes 12 connected to a meter 14 were placed across the fuse 10.

Modern printed circuit (PC) boards have made such hand testing virtually impossible. Literally hundreds of connections at close-spaced proximity must be tested to verify proper circuit continuity. To do this in an automated way, apparatus such as that shown in FIG. 2 has come into common usage. The PC board 16 is positioned on a holding table 18 and a fixture 20 having a plurality of electrical test probes 22 is brought into contact with the surface thereof. The probes 22 are connected by cable 24 to testing logic 26. In this manner, the testing logic 26 can quickly and accurately test a multitude of circuit interconnections for proper continuity.

As can be readily understood, the functioning of the probes 22 relative to the fixture 20 and their electrical connection to the testing logic 26 are critical to the successful operation of the testing apparatus. Any failure of the probe 22 to make effective electrical contact with the PC board 16 or any failure of the electrical contact so made to be effectively passed back to the testing logic 26 will be interpreted, wrongfully, by the testing logic 26 as a failure of the PC board 16.

Two aspects are critical in the overall operation of the probes 22. First, the probes 22 must have a degree of linear axial movement within the fixture 20 to accommodate variations in projection of contact points from the PC board, thereby to prevent undue pressure on the PC board 16 and/or breakage of the probe 22 while ensuring adequate electrical contact. Second, is the manner of electrically connecting a conductor from the cable 24 to the probe 22. Some of these aspects according to the prior art are shown in FIGS. 3-8.

Turning first to FIG. 3, a probe is shown according to U.S. Pat. No. 4,200,351. The probe, generally indicated as 28, comprises a spring-metal tube 30 press-fit within bore 32 of fixture 20. Probe 28 has a first cylindrical portion 34 adapted to slidably fit within the tube 30 and having a head 36 on the outer end thereof for contacting the PC board 16. A smaller diameter cylindrical shaft 38 extends from the cylindrical portion 34 in axial alignment therewith to pass through the bore 32 and terminate in an end 40 having a square cross-section particularly adapted for attachment of an electrical conductor thereto by a so-called Wire Wrap process. An enlarged portion 42 on the shaft 38 contacts the outer ends of fingers 44 formed into the tube 30 to prevent longitudinal movement out of the tube 30 of the head 36 beyond a pre-established maximum point. A spring 46 is under compression between shoulder 48 and the inside of the fingers 44 to bias the assembly to its outer position. Since the electrical connection to the probe (not shown) is directly attached to the end 40, there is no danger of loss of electrical continuity as the probe 28 is moved in and out of bore 32. On the negative side, should it be desired to reconfigure the probe 28 or replace it, the task is not a simple one.

A test probe of the type shown in U.S. Pat. No. 4,168,873 is shown in FIG. 4 and generally indicated at 50. Probe 50 comprises a socket tube 52 which is slid into a pair of aligned bores 32 in the fixture 20. Electrical connection is provided to the tube 52 by pressing the electrical conductor 54 into a pair of jaws 56 in connector member 58, which is crimped into the one end of the socket tube 52. A tubular sleeve 60 is fitted into the end of the socket tube 52 adjacent the connector member 58. The head 36 is mounted on a shaft 62 having a cylindrical portion 64 sized to slidably fit within the tube 52. Correspondingly, the inner end of the shaft 62 is sized to slidably fit within the tubular sleeve 60. Spring 46 is disposed between the tubular sleeve 60 and the cylindrical portion 64 to provide the outward biasing force on the head 36. Stop member 66 is provided to prevent the shaft 62 from moving outward past its previously selected maximum point. With this embodiment, the socket tube 52 can be easily removed from the bores 32 as necessary. To release the electrical conductor 54, however, it must be pried from between the jaws 56. Electrical contact between the moving shaft 62 and the electrical conductor 54 is hoped for by contact between the cylindrical portion 64 and the inside of the socket tube 52 in combination with contact between the inner end of the shaft 62 and the inside of the tubular sleeve 60.

Turning now to FIG. 5, a probe, generally indicated as 68, is shown according to the teachings of U.S. Pat. No. 4,461,993. In this particular case, a tube 70 is mounted within the bore 32 of fixture 20. The head 36 comprises the end of a cylindrical shaft 72 slidably mounted within a tube 74 having its opposite end 76 of a reduced diameter adapted to snugly fit within the tube 70. The electrical conductor (not shown) is electrically connected to the tube 70 in any manner desired and electrical connection is made between the tubes 70, 74 by their snug fit together in electrical contact. Shaft 72 has a reduced diameter portion 78 and a bulbous end 80. The tube 74 is crimped as at 82 to prevent the shaft 72 from moving out of tube 74 beyond its desired extension limit. A spring 46 is positioned within the tube 74 between the portion 78 and the bulbous end 80 to urge the head 36 to its extended position. While tube 74 and its assembled components can be easily removed from the tube 70 without disconnection of the electrical conductor (not shown), once again, electrical connection between the tube 74 and shaft 72 is hoped for by the sliding contact of the shaft 72 on the inside of tube 74, sliding contact of the bulbous end 80 within tube 74, and electrical contact by the spring 46 between the tube 74 and end 80.

The prior art configurations of FIGS. 6-8 are variations that can be applied to the embodiments of FIGS. 4 and 5 in an attempt to provide a greater probability that electrical contact will be provided between the outer tube and the shaft sliding therein containing the head 36. FIG. 6 corresponds to the teaching from U.S. Pat. No. 4,050,762. In this case, a spring member 82 having fingers 84 is mounted to the end of the moving shaft 86 to press against the inside walls of the tube 88.

FIG. 7 shows the teachings of U.S. Pat. No. 3,753,103, wherein a contact member 90 is connected to the end of sliding shaft 92 by a leaf spring 94 providing a biasing couple tending to urge the contact member 90 against the inside walls of the tube 96.

Finally, in FIG. 8, which corresponds to U.S. Pat. No. 4,397,519, the inner end 98 of shaft 100 is angled at surface 102 and the biasing force of the spring 46 is applied through a ball 104 against angled surface 102 which results in a biasing force vector from spring 46 also being provided against end 98 towards the inner side wall of the tube 105.

All the above-described prior art probes, many of which remain mere paper proposals, and their manner of connection to the electrical conductor connected thereto have one or more problems relating to mechanical and electrical effectiveness and reliability, and cost, ease of manufacture and ease of use. Especially as the center-to-center spacing between probes in a multi-probe fixture of necessity becomes smaller and smaller as boards to be tested become corespondingly smaller, there is a requirement for a probe which is simple to manufacture because of few and simple parts, while, at the same time, being easily replaceable and completely reliable in its electrical conductivity.

Wherefore, it is the object of the present invention to provide an electrical circuit test probe and connector combining these features.

SUMMARY

The foregoing objects have been met by an electrical circuit test probe for mounting in a test fixture bore according to the present invention, comprising a cylindrical socket tube of an electrically conductive material adapted to snugly fit within the fixture bore, the socket tube including means for electrical connection to an electrical conductor on one end and being open on its opposite end; a plunger member of an electrically conductive material having a first cylindrical portion adapted to slide fit into the open opposite end and terminating on its outer end in a head for contacting circuits to be tested, the inner end of the first cylindrical portion having a second cylindrical portion extending therefrom along a common longitudinal axis and being of a smaller diameter to form a shoulder where the two cylindrical portions join one another, the inner end of the second cylindrical member having a resilient wand extending therefrom at an angular offset to the common longitudinal axis, the wand terminating in a bulbous contact member of a diameter substantially the same as the second cylindrical portion; a cylindrical plunger tube of an electrically conductive material disposed within the socket tube and in electrical contact therewith adjacent the electrical connecting means with the contact member disposed therein and with the wand passing through an opening through which the contact member cannot pass; and a compression spring disposed between the shoulder and the plunger tube whereby a bias force is created on the plunger member towards its extended position and the contact member is maintained in good electrical contact with the inner surface of the plunger tube by the biasing force from the offset of the wand as the plunger member is moved into and out of the socket tube.

In the preferred embodiment, the electrical connecting means is a releasable connector which plugs into the end of the socket tube and comprises a cylindrical collet member of an electrically conductive material and having jaws at one end facing into a central bore, the member being adapted to have an electrical conductor disposed within the bore and between facing surfaces of the jaws; and, a plug housing of an electrically conductive material and adapted for electrical connection to a circuit, the plug housing having a first cylindrical portion with an opening on one end for receiving the collet member and being of an internal diameter to provide a slide fit for the jaws, the first cylindrical portion being connected to a second cylindrical portion by a smoothly tapered portion, the second cylindrical portion having an internal diameter sized such that as the collet member with an electrical conductor disposed therein is slid into the second cylindrical portion through the tapered portion, the jaws are squeezed together with a pressure to cause the jaws to bite into the conductor, the material of the collet member adjacent the jaws subsequently being plastically deformed to facilitate further sliding of the collet member into said plug housing to maintain the jaws in electrical connection with the conductor.

DESCRIPTION OF THE DRAWINGS

FIGS. 3-8 are drawings from prior art patents showing prior art probes.

FIG. 15 is a picture of the plunger of the present invention.

FIG. 16 is a cut-away view through the plunger tube of the present invention.

FIG. 17 is a picture of the socket tube of the present invention.

FIG. 19 is a cut-away view through the plunger tube portion of FIG. 18 with the plunger in its fully retracted position.

DESCRIPTION OF THE PREFERRED EMBODIMENTS

Figure 9:
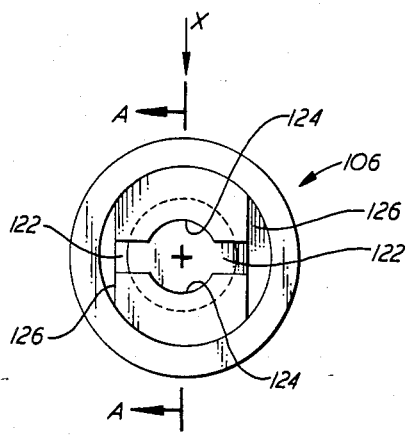
FIG. 9 is an end view of the collet member of the present invention.
Figure 10:
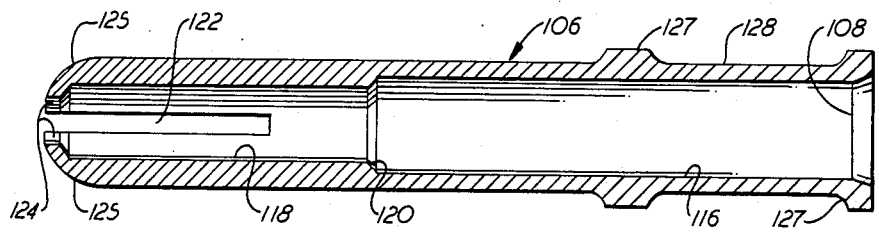
FIG. 10 is a sectional elevation along section line A—A of FIG. 9.
Figure 11:
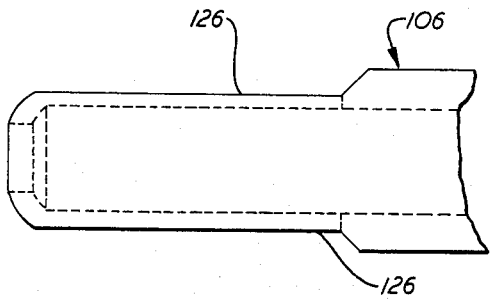
FIG. 11 is a plan view through the end of the collet member seen in the direction of arrow X in FIG. 9.

Turning first to FIGS. 9-14, the novel electrical connector portion of the present invention will first be shown and described. FIGS. 9-11 show a conductive metallic collet member, generally indicated as 106 adapted to fit over the end of an electrical conductor in a manner to be described shortly. Collet member 106 is generally cylindrical in shape and has an opening 108 into which the electrical conductor 110 can be inserted in the manner shown in FIG. 13. In use, the insulation 112 is stripped from the end of the conductor 110 exposing a portion 114 of the conducting wire contained therein. The collet member 106 has a first cylindrical portion 116 having an internal diameter adapted to fit about the insulation 112 and a second cylindrical portion 118 of a smaller diameter adapted to fit about the conducting wire 114. The two portions 116, 118 form a shoulder 120 at their point of junction, which prevents insertion of the conductor 110 past its optimal point. The ends of the second cylindrical portion 118 are slit at 122 and curved inwardly to form two facing jaws at 124. Each jaw 124 has a neck portion 125 connecting it to the remainder of the cylindrical portion. The generally cylindrical collet member 106 has parallel diametrically opposite flat surfaces 126 formed in the region of and normal to slits 122 to reduce the thickness of material in the collet 106 laterally of the jaws 124. In the preferred embodiment as manufactured by the assignee of the present invention, the collet member 106 is of brass tubing per CDA 330, being three-quarter hard. A pair of raised ridges 127 are provided circumferentially about the exterior of the collet member 106 in spaced relationship to form a groove 128 adjacent the end with the opening 108. The purpose thereof will be discussed shortly.

It will be appreciated that while two jaws have been described in this preferred embodiment, three, four or more jaws might be formed and used in the collet member 106.

Figure 1:
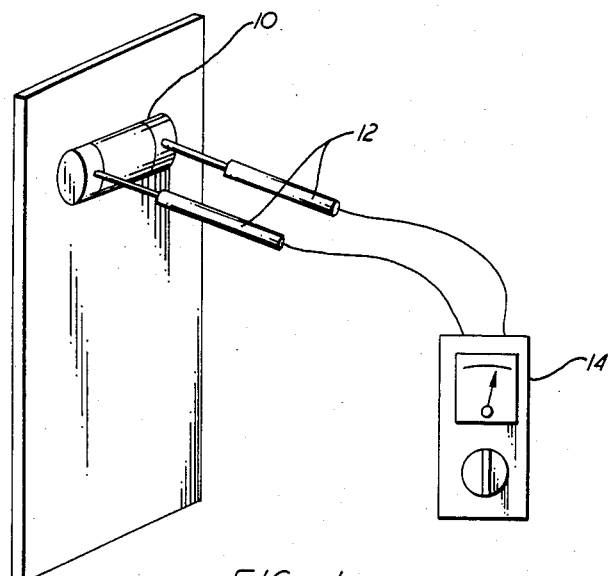
FIG. 1 is a simplified drawing of a prior art testing technique employing large size hand-held probes.
Figure 2:
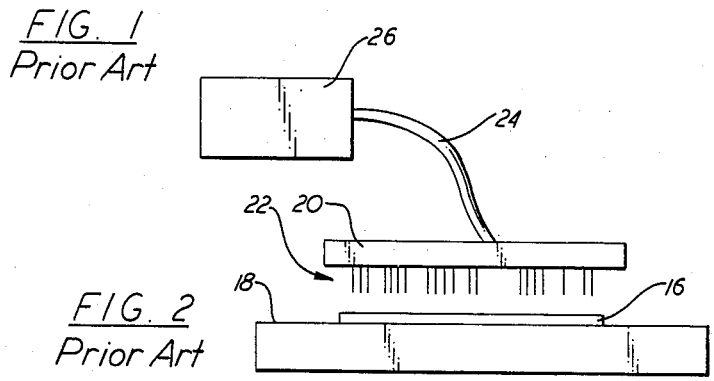
FIG. 2 is a simplified drawing of a prior art multi-probe test fixture as wherein the present invention is applicable.
Figure 12:
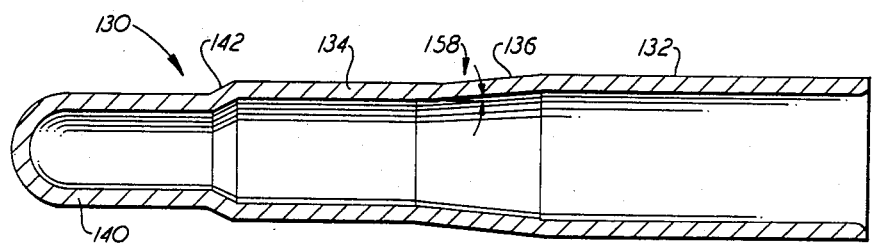
FIG. 12 is a cut-away view through the plug housing of the present invention.
Figure 6:
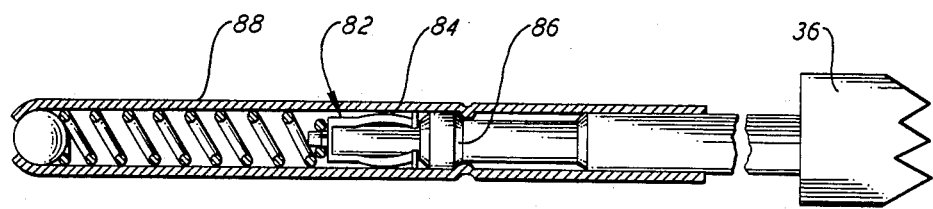
Figure 7:
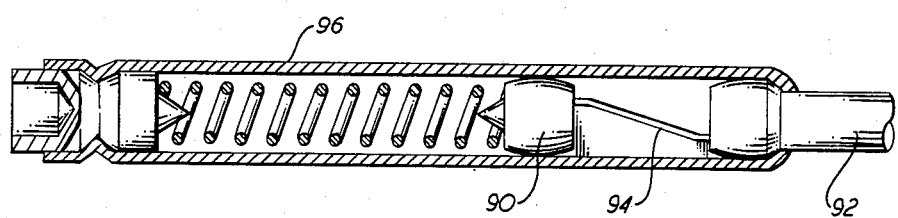
Figure 8:
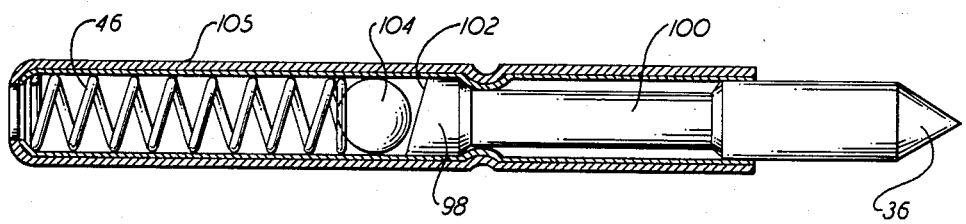
Figure 13:
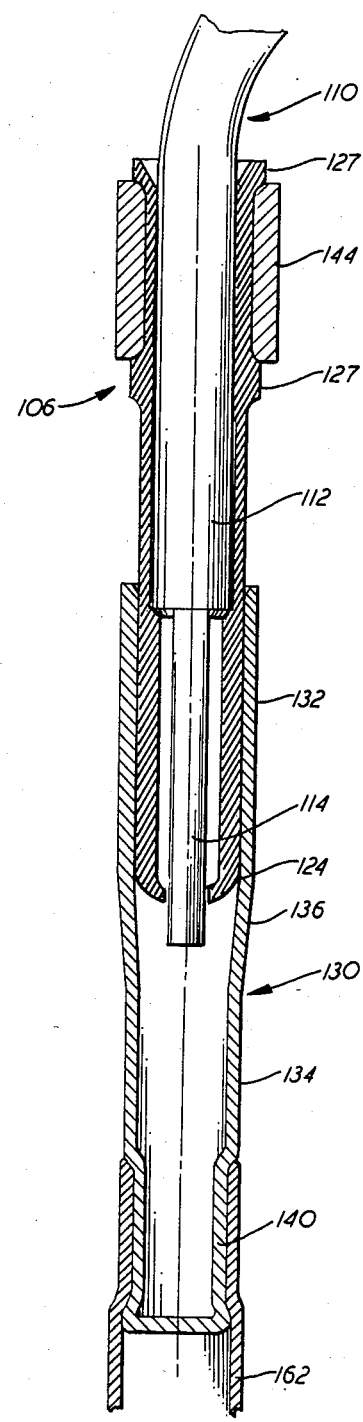
FIG. 13 is a cut-away view of the electrical connector of the present invention being assembled, but prior to the conductor being gripped.
Figure 14:
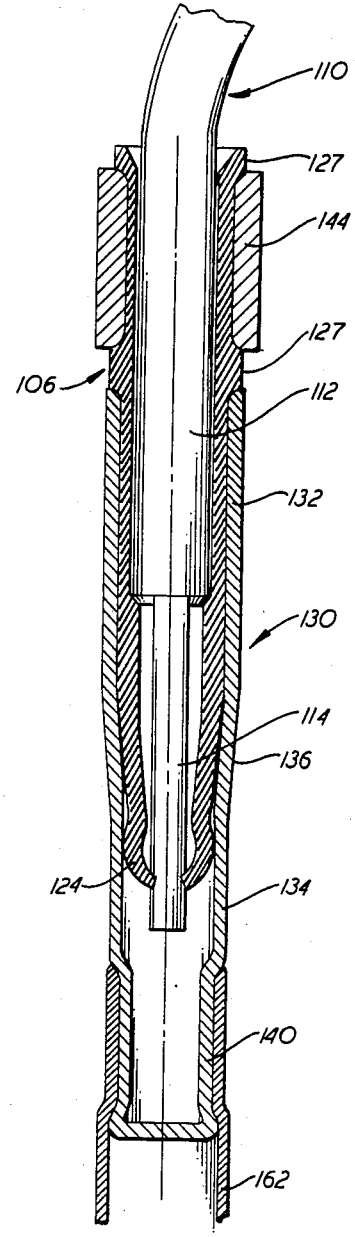
FIG. 14 is a cut-away view showing the connector of FIG. 13 in its fully inserted position.

Turning now to FIG. 12, the plug housing of the present invention is shown generally indicated as 130. Plug housing 130 is of nickel silver per CDA 752 with its internal surface clad with gold alloy and is comprised of a first cylindrical portion 132 into which the collet member 106 can be inserted in a sliding fit as shown in FIG. 13. Plug housing 130 further comprises a second cylindrical portion 134 of a smaller diameter with the two portions 132, 134 being interconnected by a tapered portion 136 smoothly tapering as shown by the angle at 138 between the portions 132, 134. The plug housing 130 past the second cylindrical portion 134 constricts to a closed end 140 of yet a smaller diameter and forming a shoulder 142 on the exterior where end 140 meets cylindrical portion 134. The end 140 is provided to allow the plug housing 130 to be mounted in the outer end of an electrical circuit test probe of the present invention, to be described shortly. Other variations could, of course, be provided within the scope and spirit of the present invention. As will be recognized by those skilled in the art, all that is required is that the plug housing 130 be provided with some means for electrically connecting it to the circuit to which it is going to provide releasable electrical access.

Turning now to FIG. 13, it can be seen that in use, the stripped electrical conductor 110 is inserted into the open end 108 of the collet member 106 with the insulation 112 abutting against shoulder 120 and the conducting wire 114 passing between the facing jaws 124. A heat shrinkable cylindrical member 144 of electrically insulating material is disposed around the member 106 between the raised ridges 127 and shrunk into the groove 128 to thereby grip the groove. Member 144 has an outer diameter greater than the outer diameter of the probe and connector thereby to provide electrical separation between adjacent probes in a test fixture. The jaws 124 of the collet member 106 are inserted into the plug housing 130 as shown in FIG. 13 and then the entire member 106 is forced into the plug housing 130 until the innermost raised ridge 126 abuts the outer end of the plug housing 130. In that movement, the jaws 124 are slid along the tapering portion 136 and into the reduced diameter second cylindrical portion 134. In so doing the jaws are forced to bite into wire 114 to produce electrically conductive gripping communication therewith with further insertion causing the necked portions 125 to be stressed sufficiently for them to plastically deform to maintain the facing jaws 124 in intimate (biting) electrical contact with the conducting wire 114 while permitting complete insertion of the collet member 106 into plug housing 130. Moreover, the jaws 124 are moved away from the tapering portion 136 and well into the second cylindrical portion 134 such that their outward force tends to hold the collet member 106 within the plug housing 130.

Turning now to FIGS. 15-19, the electrical circuit test probe portion of the present invention will be shown and described with particularity.

Turning first to FIG. 15, the plunger thereof is generally indicated as 146. Plunger 146 comprises a first cylindrical portion 148 (in some embodiments may have a portion thereof, intermediate its ends, relieved to form two spaced cylindrical surfaces which together correspond to portion 148) having an electrical contact 36 at one end. Extending from the opposite end is a second cylindrical portion 152 of a smaller diameter and in alignment with a common longitudinal axis 154. Extending from the other end of the portion 152 is a wand portion 156 of yet a smaller diameter and terminating in a bulbous contact portion 158 of a diameter substantially identical to that of the second cylindrical portion 152. The plunger is of heat treated beryllimum copper 33-25 or M25, being one-half hard per CDA 173 and plated with 50 micro-inches of gold over 100 micro-inches of nickel. The wand portion 156 in the tested embodiment is 0.0092 inches in diameter and is offset from the common longitudinal axis 154 a distance of 0.010 inches in a length of 0.18 inches. As thus sized and constructed, it can be realized that the wand portion 156 acts as a flexible finger with the contact portion 158 at the end thereof.

Turning now to FIG. 16, the plunger tube is indicated as 160. Plunger tube 160 has an internal diameter sized to be a loose slide fit for the contact portion 158 of plunger 146. The plunger tube in the tested embodiment is CDA #725 clad on both sides with gold alloy.

Figure 18:
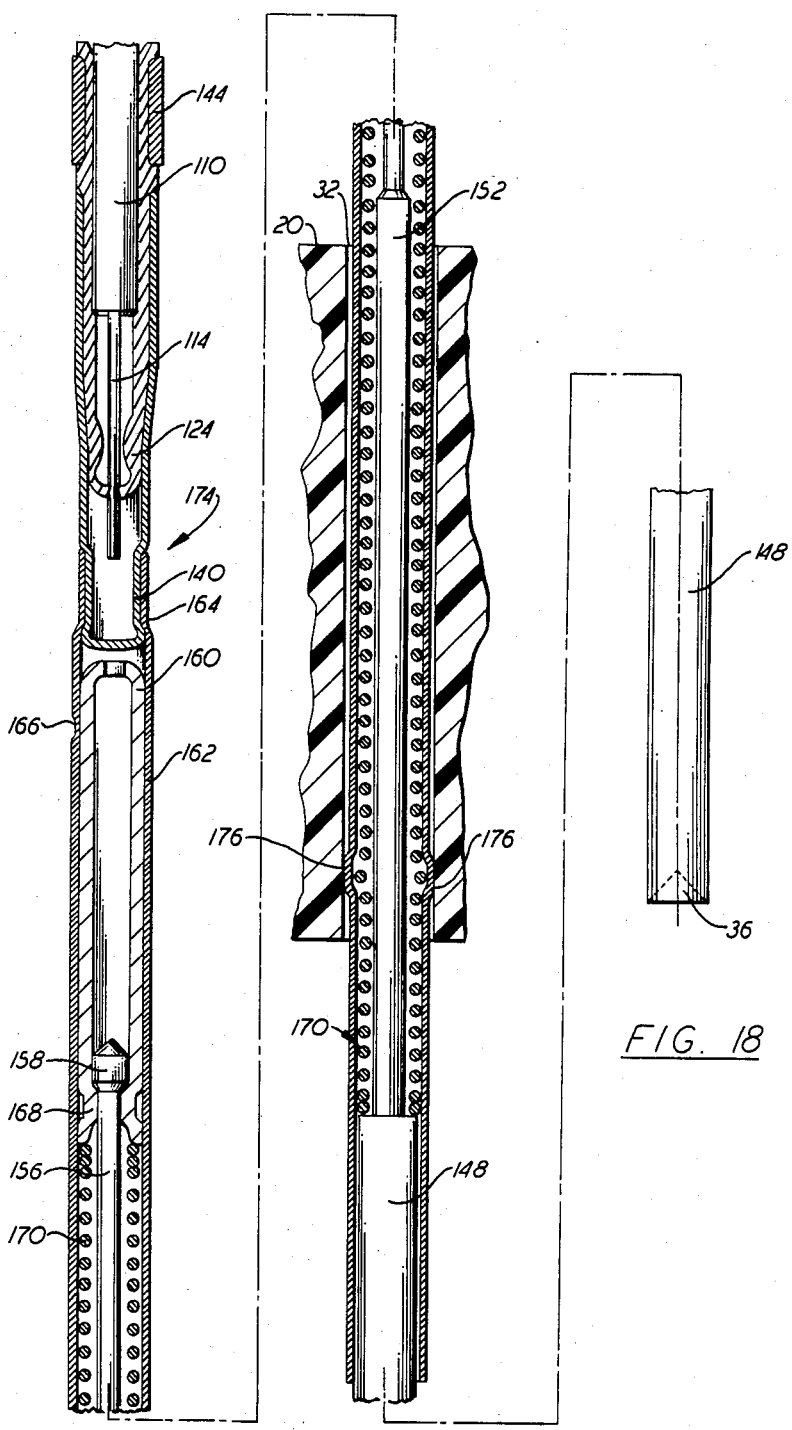
FIG. 18 is a cut-away view through the probe and connector of the present invention in its fully assembled state.

Turning now to FIG. 17, the socket tube of the present invention is generally indicated as 162. The socket tube 162 in the tested embodiment is of beryllium copper alloy clad with a silver alloy on the internal surfaces. The sizing and interaction of the various parts will be understood from the description which follows with respect to FIG. 18. First, end 164 of tube 162 is sized to receive end 140 of plug housing 130. When end 140 is inserted into end 164 and the tube crimped together, a secure point of mechanical and electrical contact to socket tube 162 is provided. Socket tube 162 is indented at 166. The outer diameter of plunger tube 160 is sized such that it can be slid into socket tube 162 and be held in place adjacent the ends 140, 164 by the interference fit pressure of the indentation 166. Prior to such insertion, however, bulbous end 158 is inserted into the plunger tube 160 and the end at 168 crimped about the wand 156 to a size that allows the wand 156 to easily slide therethrough, but being of an opening size insufficient to allow the bulbous end portion 158 to pass back therethrough. Accordingly, contact portion 158 is trapped within the plunger tube 160. Again, prior to such insertion and crimping however, compression spring 170 is slid over the wand 156 and second cylindrical portion 152 into abutment with the shoulder 172 where the second cylindrical portion 152 joins the first cylindrical portion 148. Then, as the plunger tube is positioned and crimped, the spring 170 is trapped between the shoulder 172 and the end 168 of the plunger tube 160. Thereafter, the plunger tube 160 is positioned within the socket tube 162 as shown in FIG. 18, which holds the entire probe assembly, generally indicated as 174, in assembled condition. The probe assembly 174 can be disposed within a bore 32 on a fixture 20 and is held in place by the snug gripping action of one or more raised areas 176 on the outer periphery of the tube 162. These raised areas 176 are preferably disposed in a portion of the socket tube 162 remote from the innermost projection, in use, of the first cylindrical portion 148 into the socket tube.

As the plunger tube 160 is slid into the socket tube 162 followed by the cylindrical portion 148 of the plunger 146, the wand 156, of necessity, is straightened out from its offset position, thus creating a biasing force by the contact portion 158 against the interior precious metal clad surface of the plunger tube 160. Thus, as shown in FIG. 19, the contact portion 158 is held firmly against the inside of the plunger tube 160 throughout its entire length of travel, whereby continuous electrical contact is assured.

Thus, it can be seen from the foregoing description that the present invention has truly met its desired objectives. Construction is simple and of a minimum of parts, which are all of easily fabricated design. The plunger 146, for example, is of unitary construction. The electrical connector is easily removed, while, at the same time, being of small size and affording a firm electrical grip. In the tested embodiment by the assignee of the present invention, center-to-center dimensions of as little as 0.050 inches have been easily obtained with reliable results and ease of use in a probe capable of a longer stroke than prior art probes coupled with higher spring generated contact pressures to ensure reliable electrical contact with PCB's being tested.

We claim:
1. An electrical circuit test probe for mounting in a mounting hole in a test fixture board comprising:
    (a) a cylindrical socket tube of an electrically conductive material sized to snugly fit within the mounting hole of the fixture board, said socket tube including means for electrically connecting to an electrical conductor on one end, and being open on its opposite end;
    (b) a longitudinal plunger member of an electrically conductive material having inner and outer ends and a first cylindrical portion slide fitted into said open opposite end and terminating on said outer end in an electrical contact for contacting circuits to be tested, said inner end of said first cylindrical portion being disposed within said socket tube and having a second cylindrical portion extending therefrom along a common longitudinal axis and being of a smaller diameter to form a shoulder where said two cylindrical portions join one another, said inner end of said second cylindrical member having a resiliently flexible wand extending therefrom at an angular offset to said common longitudinal axis, said wand terminating in a bulbous contact member of a diameter substantially the same as said second cylindrical portion;
    (c) a cylindrical plunger tube of an electrically conductive material disposed within said socket tube and in electrical contact therewith adjacent said electrical connecting means with said contact member disposed therein and with said wand passing through an opening through which said contact member cannot pass; and,
    (d) a compression spring disposed between said shoulder and said plunger tube to create a bias force on said plunger member towards its extended position whereby said contact member is maintained in good electrical contact with the inner surface of said plunger tube by said biasing force from said offset of said wand as said plunger member is moved into and out of said socket tube.

2. The test probe of claim 1 wherein:
    said means for electrically connecting said probe is a releasable connector which plugs into said end of said socket tube.

3. In an electrical circuit test probe for mounting in a test fixture, including a socket tube with a cylindrical spring loaded plunger therein having inner and outer ends and an electrical contact on said outer end, the improvement for assuring electrical contact between the inner surface of the socket and the plunger as the plunger moves longitudinally comprising;
    (a) the plunger having a first cylindrical portion and having a resiliently flexible wand extending into the socket tube therefrom at an angular offset to the longitudinal axis of said plunger, said wand terminating in a bulbous contact member;
    (b) a cylindrical plunger tube of an electrically conductive material disposed within the socket tube and in electrical contact with the inner surface thereof and with said bulbous contact member disposed therein and with said wand passing through an opening through which said bulbous contact member cannot pass, whereby bulbous contact member is maintained in good electrical contact with said plunger tube and therethrough with the inner surface of said plunger tube by the biasing force from said offset of said wand as the plunger is moved into and out of the socket tube and, said cylindrical spring being disposed in compression between said plunger tube and a shoulder on said first cylindrical portion.

4. The improvement of claim 3, and additionally comprising:
    the socket tube having releasable connector means for releasably connecting an electrical conductor thereto.

5. The improvement of claim 4 wherein said releasable connector means comprises:
    (a) a socket formed into the end of the socket tube; and,
    (b) plug means for electrically gripping the end of an electrical conductor and for releasably fitting into said socket in electrical contact therewith.

6. An electrical circuit test probe for mounting in a mounting hole in a test fixture board comprising:
    (a) a cylindrical socket tube of an electrically conductive material, said socket tube being sized to snugly fit in the mounting hole, including means for electrical connection to an electrical conductor on one end, and defining an opening at its opposite end;

(b) a longitudinal plunger member of an electrically conductive material disposed in said socket tube, having inner and outer ends and a cylindrical portion with a longitudinal axis and sized to be a sliding fit in said socket tube adjacent said opening, said plunger member terminating at said outer end in an electrical contact for contacting circuits to be tested, said inner end of said cylindrical portion having a projection extending longitudinally from said cylindrical portion and forming therewith an annular shoulder, a portion of said projection terminating in a bulbous contact member, being resilient and disposed at an angular offset to said longitudinal axis;

(c) a cylindrical plunger tube of an electrically conductive material disposed within said socket tube and in electrical contact therewith adjacent said electrical connecting means with said bulbous contact member slidably disposed therein to contact an inner surface thereof and with said projection passing through an opening in said plunger tube through which said bulbous contact member cannot pass; and, (d) a coil spring disposed in compression between said shoulder and said plunger tube;

(e) said bulbous contact member being maintained in electrical contact with said inner surface of said plunger tube by the biasing force from said offset of said projection as said plunger slides therein.

7. An electrical circuit test probe for mounting in a test fixture board comprising:

(a) a cylindrical socket tube of an electrically conductive material adapted to snugly fit within the fixture bore, said socket tube including means for electrically connecting to an electrical conductor on one end, and being open on its opposite end;

(b) a plunger member of an electrically conductive material having a first cylindrical portion adapted to slide fit into said open opposite end and terminating on its outer end in an electrical contact for contacting circuits to be tested, the inner end of said first cylindrical portion having a second cylindrical portion extending therefrom along a common longitudinal axis and being of a smaller diameter to form a shoulder where said two cylindrical portions join one another, the inner end of said second cylindrical member having a wand extending therefrom, said wand terminating in a bulbous contact member of a diameter substantially the same as said second cylindrical portion;

(c) a cylindrical plunger tube of an electrically conductive material disposed within said socket tube and in electrical contact therewith adjacent said electrical connecting means with said contact member disposed therein and with said wand passing through an opening through which said bulbous contact member cannot pass; and, (d) an electrically conductive compression spring disposed between said shoulder and said plunger tube whereby a bias force is created on said plunger member towards its extended position.

8. An electrical circuit test probe for mounting in a test fixture board comprising:

(a) a cylindrical socket tube of an electrically conductive material said socket tube including means for electrical connection to an electrical conductor on one end, and defining an opening at its opposite end;

(b) a plunger member of an electrically conductive material having a cylindrical portion defining a longitudinal axis and adapted to have a sliding fit in said socket tube adjacent said opening and terminating at its outer end in an electrical contact for contacting circuits to be tested, the inner end of said cylindrical portion having a projection extending generally longitudinally of said cylindrical portion and forming therewith an annular shoulder, a portion of said projection terminating in a bulbous contact member;

(c) a cylindrical plunger tube of an electrically conductive material disposed within said socket tube in electrical contact therewith adjacent said electrical connecting means with said bulbous contact member slidably disposed therein and with said projection passing through an opening in said plunger tube through which said bulbous contact member cannot pass; and, (d) a coil spring of an electrically conductive material disposed in compression between said shoulder and said plunger tube.

* * * * *